(12) United States Patent
Shirai et al.

(10) Patent No.: US 9,923,642 B2
(45) Date of Patent: Mar. 20, 2018

(54) LIGHT RECEIVING DEVICE

(71) Applicant: Mitsubishi Electric Corporation, Chiyoda-ku (JP)

(72) Inventors: Satoshi Shirai, Tokyo (JP); Masaki Noda, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/538,075

(22) PCT Filed: Feb. 23, 2015

(86) PCT No.: PCT/JP2015/055037
§ 371 (c)(1),
(2) Date: Jun. 20, 2017

(87) PCT Pub. No.: WO2016/135824
PCT Pub. Date: Sep. 1, 2016

(65) Prior Publication Data
US 2018/0019825 A1    Jan. 18, 2018

(51) Int. Cl.
*H04B 10/06* (2006.01)
*H04B 10/00* (2013.01)
(Continued)

(52) U.S. Cl.
CPC ............ *H04B 10/6911* (2013.01); *G01J 1/44* (2013.01); *G01J 2001/4406* (2013.01);
(Continued)

(58) Field of Classification Search
CPC .............. H04B 10/6911; H04B 10/152; H04B 10/158; H04B 10/40; G01J 1/44;
(Continued)

(56) References Cited

U.S. PATENT DOCUMENTS 4,819,241 A * 4/1989 Nagano ................. G11B 7/126 327/514
5,539,779 A * 7/1996 Nagahori ........... H04B 10/6933 327/307

(Continued)

FOREIGN PATENT DOCUMENTS

JP  7-27607 A   1/1995
JP  11-205249 A 7/1999
(Continued)

OTHER PUBLICATIONS

International Search Report dated Mar. 24, 2015 in PCT/JP2015/055037 filed Feb. 23, 2015.
(Continued)

*Primary Examiner* — Ken N Vanderpuye
*Assistant Examiner* — Abbas H Alagheband
(74) *Attorney, Agent, or Firm* — Oblon, McClelland, Maier & Neustadt, L.L.P.

(57) ABSTRACT

A light receiving device that receives a light signal includes: a plurality of avalanche photodiodes, in each of which receiving sensitivity is set in accordance with a bias signal that is provided; a plurality of level conversion units provided in association with the avalanche photodiodes, each of the level conversion units being configured to convert a level of a reference voltage for obtaining the bias signal so as to generate the bias signal and being configured to provide the bias signal to corresponding one of the avalanche photodiodes; and a control unit that generates a first control signal corresponding to a temperature of the light receiving device, and controls a level conversion amount of each of the level conversion units by using the first control signal.

6 Claims, 11 Drawing Sheets

(51) Int. Cl.
*H04B 10/12* (2006.01)
*H04B 10/17* (2006.01)
*H04B 10/69* (2013.01)
*G01J 1/44* (2006.01)
*H04B 10/40* (2013.01)
*H01J 40/14* (2006.01)
*H03G 3/20* (2006.01)

(52) U.S. Cl.
CPC ....... *G01J 2001/4466* (2013.01); *H01J 40/14* (2013.01); *H03G 3/20* (2013.01); *H04B 10/152* (2013.01); *H04B 10/40* (2013.01)

(58) Field of Classification Search
CPC ....... G01J 2001/4406; G01J 2001/4466; H01J 40/14; H03G 3/20
USPC .................. 398/202, 197, 182, 183, 136, 38
See application file for complete search history.

(56) References Cited

U.S. PATENT DOCUMENTS

| | | | | |
|---|---|---|---|---|
| 5,578,815 A * | 11/1996 | Nakase | ...................... | G05F 3/18 250/214 C |
| 5,625,181 A * | 4/1997 | Yasuda | ................ | H03G 3/3084 250/214 A |
| 5,953,690 A * | 9/1999 | Lemon | ................ | H03G 3/3089 250/214 C |
| 6,157,022 A * | 12/2000 | Maeda | ............... | H01L 31/02027 250/214 AG |
| 6,574,022 B2 * | 6/2003 | Chow | ................... | G02B 6/4202 385/14 |
| 6,891,408 B2 * | 5/2005 | Nishizono | ............... | H03F 3/087 327/103 |
| 7,060,970 B2 * | 6/2006 | Cheung | ............. | H01L 31/02027 250/214 C |
| 7,170,335 B2 * | 1/2007 | Elsheimer | ............. | G06F 3/0312 327/37 |
| 7,217,914 B2 * | 5/2007 | Stewart | .............. | H04B 10/6911 250/214 R |
| 7,265,334 B2 * | 9/2007 | Draper | ................ | H01S 5/06804 250/214 C |
| 7,297,922 B2 * | 11/2007 | Giovannini | ............ | H04B 10/66 250/214 AG |
| 7,323,671 B1 * | 1/2008 | Toros | ................ | H01L 27/14654 250/208.1 |
| 7,326,921 B2 * | 2/2008 | Matsumoto | ....... | H01L 31/02027 250/214 C |
| 7,705,284 B2 * | 4/2010 | Inoue | ........................ | G01J 1/44 250/214 AG |
| 8,274,035 B2 * | 9/2012 | Liu | ........................... | G01J 1/44 250/205 |
| 2002/0114365 A1 * | 8/2002 | Gilliland | ................. | H01S 5/042 372/38.02 |
| 2002/0131135 A1 * | 9/2002 | Chow | ................... | G02B 6/4202 398/202 |
| 2003/0030951 A1 * | 2/2003 | Green | ............... | H01L 31/02027 361/56 |
| 2004/0075484 A1 * | 4/2004 | Nishizono | ............... | H03F 3/087 327/345 |
| 2005/0001152 A1 * | 1/2005 | Stewart | .............. | H04B 10/6911 250/214 R |
| 2005/0006567 A1 * | 1/2005 | Stewart | .............. | H04B 10/6911 250/214 R |
| 2006/0016894 A1 * | 1/2006 | Matsumoto | ....... | H01L 31/02027 235/454 |
| 2009/0232517 A1 * | 9/2009 | Farina | .............. | H04B 10/50572 398/183 |
| 2012/0045202 A1 * | 2/2012 | Jiang | ..................... | H04B 10/40 398/38 |
| 2017/0163346 A1 * | 6/2017 | Aronson | ................ | G01M 11/00 |

FOREIGN PATENT DOCUMENTS

| | | |
|---|---|---|
| JP | 2005-354485 A | 12/2005 |
| JP | 3785035 B2 | 6/2006 |
| JP | 2008-48334 A | 2/2008 |
| JP | 4838154 B2 | 12/2011 |
| JP | 5368370 B2 | 12/2013 |

OTHER PUBLICATIONS

Written Opinion dated Mar. 24, 2015 in PCT/JP2015/055037 filed Feb. 23, 2015.

* cited by examiner

FIG.9

| TEMPERATURE t[°C] | BASE-EMITTER VOLTAGE Vbe (t) [V] OF TRANSISTOR 24 |
|---|---|
| LOW ↕ HIGH | HIGH ↕ LOW |

| TEMPERATURE t[°C] | CONTROL SIGNAL S1 FOR Ch1 LEVEL CONVERSION CIRCUIT | ...... | CONTROL SIGNAL S1 FOR Chn LEVEL CONVERSION CIRCUIT |
|---|---|---|---|
| ⋮ | | | |
| 40 | ○○○○ | ...... | △△△ |
| 41 | ○○○○ | ...... | △△△ |
| 42 | ○○○○ | ...... | △△△ |
| ⋮ | | | |

145A

| TEMPERATURE t[°C] | CONTROL SIGNAL S2 FOR BOOSTER CIRCUIT |
|---|---|
| ⋮ | |
| 40 | × × × × |
| 41 | × × × × |
| 42 | × × × × |
| ⋮ | |

145B

| TEMPERATURE t[°C] | CONTROL SIGNAL S2 FOR BOOSTER CIRCUIT | CONTROL SIGNAL S1 FOR Ch1 LEVEL CONVERSION CIRCUIT | ······ | CONTROL SIGNAL S1 FOR Chn LEVEL CONVERSION CIRCUIT |
|---|---|---|---|---|
| ⋮ | | | | |
| 40 | × × × × | ○○○○ | ······ | △△△ |
| 41 | × × × × | ○○○○ | ······ | △△△ |
| 42 | × × × × | ○○○○ | ······ | △△△ |
| ⋮ | | | | |

145

LIGHT RECEIVING DEVICE

FIELD

The present invention relates to a light receiving device for use in optical communication.

BACKGROUND

A light receiving device for use in optical communication can include an avalanche photodiode (hereinafter referred to as APD) capable of receiving light by amplifying a light receiving signal. The APD is a photodiode in which a phenomenon called avalanche multiplication is utilized to increase light receiving sensitivity. By including the APD, the light receiving device can receive a light signal attenuated over long-distance transmission.

In Patent Literature 1, a bias circuit including a temperature sensor, a memory, and a central processing unit (CPU) is used. Specifically, the memory stores temperature data for a bias voltage for an APD, and the CPU controls the bias voltage for the APD based on the data stored in the memory. With this configuration, the APD can be driven at the optimal bias voltage at any time.

CITATION LIST

Patent Literature

Patent Literature 1: Japanese Patent No. 3785035

SUMMARY

Technical Problem

In recent years, a light receiving device including APDs arranged in parallel with one another has been required in a system using wavelength multiplexing. In this case, a plurality of bias circuits are required. This leads to such a problem that the size of the light receiving device is increased. Other problems also occur: The power consumption is increased due to a plurality of booster circuits, and the cost of the device is increased due to an increase in the number of components.

The present invention has been made in consideration of the above-mentioned circumstances, and an objective thereof is to obtain a light receiving device capable of suppressing an increase in the size of the device and realizing a low-cost structure that consumes less power.

Solution to Problem

In order to solve the problem and achieve the objective, the present invention provides a light receiving device that receives a light signal. The light receiving device includes: a plurality of avalanche photodiodes, in each of which receiving sensitivity is set in accordance with a bias signal provided; a plurality of level conversion units provided in association with the avalanche photodiodes, each of the level conversion units being configured to convert a level of a reference voltage for obtaining the bias signal so as to generate the bias signal and being configured to provide the bias signal to corresponding one of the avalanche photodiodes; and a control unit to generate a first control signal corresponding to a temperature of the light receiving device, and to control a level conversion amount of each of the level conversion units by using the first control signal.

Advantageous Effects of Invention

A light receiving device according to the present invention can achieve an effect of suppressing an increase in the size of the device and realizing a low-cost configuration that consumes less power.

BRIEF DESCRIPTION OF DRAWINGS

FIG. 9 is a diagram illustrating an example of a temperature dependence table for the base-emitter voltage of the transistor for use in the light receiving device according to the first embodiment of the present invention.

DESCRIPTION OF EMBODIMENTS

Hereinafter, a light receiving device according to embodiments of the present invention will be described in detail with reference to the drawings. The present invention is not limited to the embodiments.

First Embodiment

Figure 1:
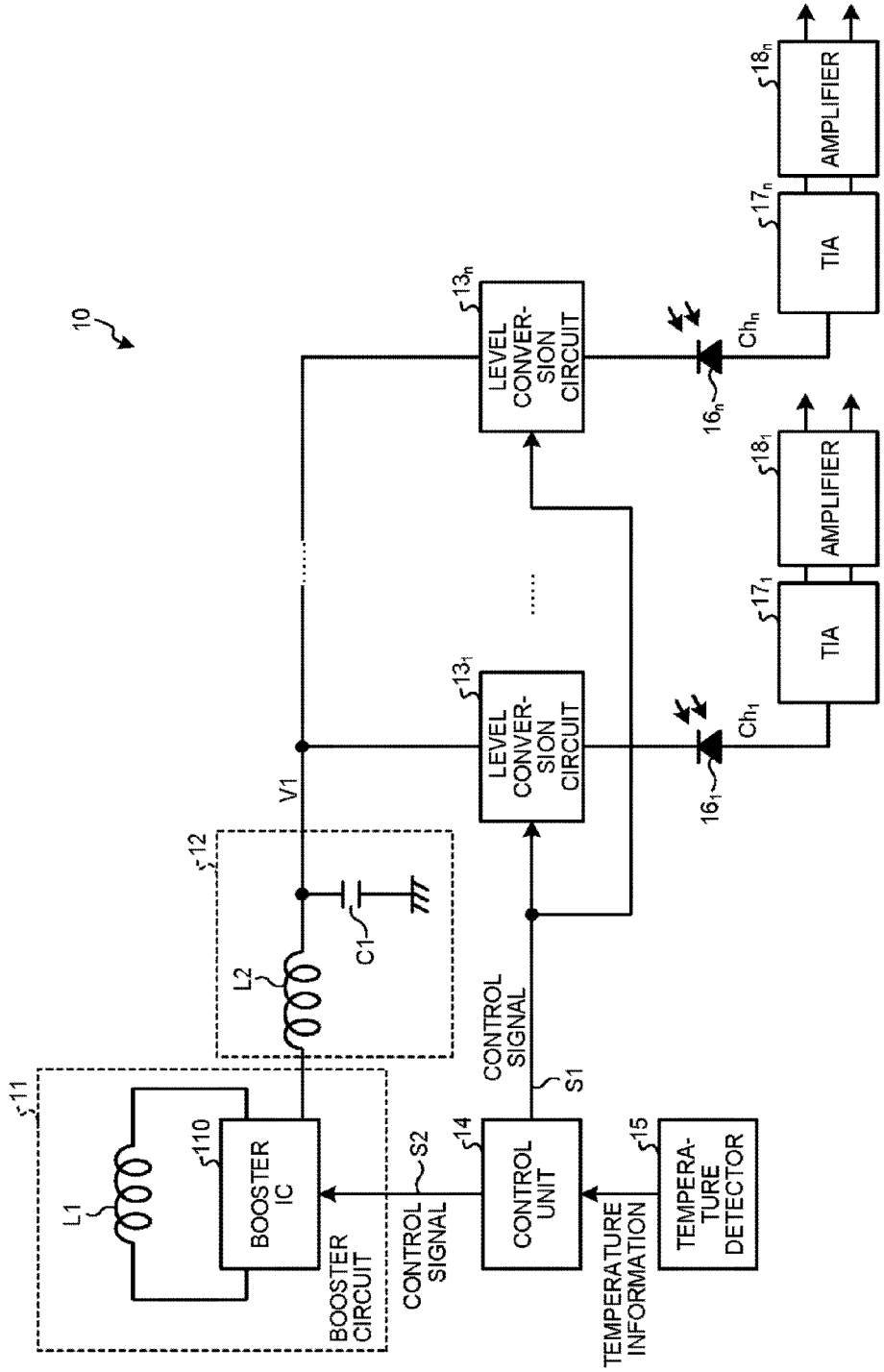
FIG. 1 is a block diagram illustrating a light receiving device according to a first embodiment of the present invention.

FIG. 1 is a block diagram illustrating a light receiving device according to a first embodiment of the present invention. The light receiving device 10 illustrated in FIG. 1 includes a booster circuit 11; a filter 12; level conversion circuits $13_1, \ldots, 13_n$; n APDs $16_1, \ldots, 16_n$; a control unit 14; a temperature detector 15; n trans-impedance amplifiers (TIAs) $17_1, \ldots, 17_n$; and n amplifiers $18_1, \ldots, 18_n$. Note that n is an integer with a value of two or more and this also applies to the following descriptions. The booster circuit 11 is a booster unit that boosts the power supply voltage of the device. The filter 12 removes noise in the voltage generated by the booster circuit 11. The n level conversion circuits $13_1, \ldots, 13_n$ are n level conversion units, each of which converts the voltage level of the DC voltage transmitted by the filter 12 in order to generate a bias voltage that is a bias signal. In each of the n APDs $16_1, \ldots, 16_n$, the receiving sensitivity is set in accordance with the provided bias voltage. The control unit 14 provides, to each of the level conversion circuits $13_1, \ldots, 13_n$, a first control signal S1 that is based on temperature information, and it also provides, to the booster circuit 11, a second control signal S2 that is based on the temperature information. The temperature detector 15 detects the temperature of the device and outputs the temperature information to the control unit 14. The n TIAs $17_1, \ldots, 17_n$ convert currents output from the APDs $16_1, \ldots, 16_n$ into voltages. The n amplifiers $18_1, \ldots, 18_n$ amplify the voltages converted by the TIAs $17_1, \ldots, 17_n$. As used herein, the device means the light receiving device 10.

The booster circuit 11 includes a booster integrated circuit (IC) 110 and an inductor L1. The booster circuit 11 generates a voltage by boosting the power supply voltage in accordance with the second control signal S2 input to the booster IC 110 and the inductance of the inductor L1. The voltage generated by the booster circuit 11 is a DC voltage that is provided as a reference voltage to the level conversion circuits $13_1, \ldots, 13_n$ for obtaining the bias voltages to be provided to the APDs $16_1, \ldots, 16_n$. In a case where the control signal S2 is a digital signal, the booster circuit 11 can have a conversion circuit that converts the digital signal into an analog signal.

The filter 12 includes an inductor L2 and a capacitor C1. One end of the inductor L2 is connected to an output of the booster circuit 11. The capacitor is connected between the other end of the inductor L2 and ground. The filter 12 functions as a low-pass filter. The filter 12 removes the high-frequency component of the reference voltage generated by the booster circuit 11. A voltage V1 at the other end of the inductor L2 is provided as the reference voltage V1 to the level conversion circuits $13_1, \ldots, 13_n$.

The n level conversion circuits $13_1, \ldots, 13_n$ are provided in association with the n APDs $16_1, \ldots, 16_n$. The level conversion circuits $13_1, \ldots, 13_n$ generate the bias voltages that are provided to the corresponding APDs $16_1, \ldots, 16_n$.

The level conversion circuits $13_1, \ldots, 13_n$ convert the voltage level of the reference voltage V1 in order to generate the bias voltages Vapd. The level conversion circuits $13_1, \ldots, 13_n$ provide the bias voltages Vapd to the corresponding APDs $16_1, \ldots, 16_n$.

The control unit 14 generates the control signal S1, which corresponds to the temperature of the device, and controls the level conversion amount of each of the level conversion circuits $13_1, \ldots, 13_n$ by using the control signal S1. The control unit 14 also generates the control signal S2, which corresponds to the temperature of the device, and controls the reference voltage that is generated by the booster circuit 11 by using the control signal S2.

The temperature detector 15 detects the temperature of the device at regular time intervals, and it outputs the temperature information to the control unit 14. More specifically, the temperature of each component constituting the light receiving device 10 is regarded as the temperature of the device. For example, the average of the temperatures of the APDs $16_1, \ldots, 16_n$ of the light receiving device 10, the average of the temperatures of the level conversion circuits $13_1, \ldots, 13_n$, or the temperature of the air in a housing is regarded as the temperature of the device.

The APDs $16_1, \ldots, 16_n$ are connected in parallel with the filter 12. The APDs $16_1, \ldots, 16_n$ are provided in association with n channels $Ch_1$ to $Ch_n$ in order to realize wavelength multiplexing. Each of the APDs $16_1, \ldots, 16_n$ receives light by amplifying a light receiving signal. A voltage of about 30 [V] to 50[V] is provided to each of the APDs $16_1, \ldots, 16_n$ for amplifying the received signal. The voltage provided to each of the APDs $16_1, \ldots, 16_n$ for amplifying the received signal is referred to as the bias voltage.

In the light receiving device 10, the n trans-impedance amplifiers (TIAs) $17_1, \ldots, 17_n$ and the n amplifiers $18_1, \ldots, 18_n$ are provided in association with the n APDs $16_1, \ldots, 16_n$. In the light receiving device 10, the n APDs $16_1, \ldots, 16_n$ are connected in parallel with the control unit 14, the booster circuit 11, and the filter 12. In the light receiving device 10, the booster circuit 11, the filter 12, the control unit 14, and the temperature detector 15 are shared by the APDs $16_1, \ldots, 16_n$.

The n TIAs $17_1, \ldots, 17_n$ are provided in a stage following the APDs $16_1, \ldots, 16_n$. The n TIAs $17_1, \ldots, 17_n$ convert the respective currents output from the APDs $16_1, \ldots, 16_n$ into the voltages.

The n amplifiers $18_1, \ldots, 18_n$ amplify the respective voltages converted by the corresponding TIAs $17_1, \ldots, 17_n$. The respective electric signals amplified by the n amplifiers $18_1, \ldots, 18_n$ are output from the light receiving device 10.

(Exemplary Configuration of Control Unit)

Figure 2:
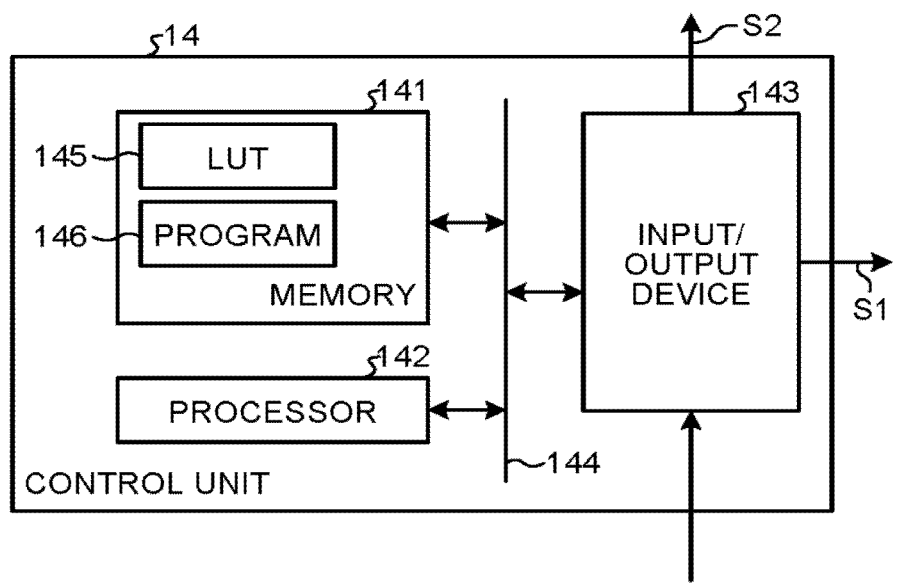
FIG. 2 is a diagram illustrating an exemplary configuration of a control unit of the light receiving device according to the first embodiment of the present invention.

FIG. 2 is a diagram illustrating an exemplary configuration of the control unit 14 of the light receiving device according to the first embodiment of the present invention. As illustrated in FIG. 2, the control unit 14 has a memory 141, a processor 142, an input/output device 143, and a bus 144. The memory 141 stores a program 146 and data required for a process. The processor 142 reads the program 146 from the memory 141 and executes the program 146. The input/output device 143 functions as an interface for the input of the temperature information and the output of the control signals S1 and S2. The components in the control unit 14 are coupled to one another via the bus 144. The memory 141 stores a look-up table (LUT) 145. The control unit 14 functions as a micro control unit (MCU) that controls the writing of data to the memory 141 and the reading of data from the memory 141. The look-up table 145 is a table that correlates the temperature information with the first control signal S1 for each of the level conversion circuits 13$_1$, . . . , 13$_n$ and with the second control signal S2 for the booster circuit 11. The control unit 14 can be realized by a general-purpose microprocessor and a general-purpose memory, or the control unit 14 can be realized by a dedicated integrated circuit having an MCU's functions.

The control unit 14 stores, in the look-up table 145, a digital value of the control signal S1 for each of the level conversion circuits 13$_1$, . . . , 13$_n$ and a digital value of the control signal S2 for the booster circuit 11 which corresponds to the temperature. The control unit 14 writes and reads data to and from the look-up table 145 by using the processor 142. The temperature information detected by the temperature detector 15 is input to the control unit 14 via the input/output device 143. The control unit 14 outputs, via the input/output device 143, the control signals S1 and S2, which have values that correspond to the temperature information. The control unit 14 controls the level conversion amount of each of the level conversion circuits 13$_1$, . . . , 13$_n$ by using the control signal S1 output via the input/output device 143, and it also controls the reference voltage that is output by the booster circuit 11 by using the control signal S2 output via the input/output device 143, whereby the bias voltage for each APD is generated. In the first embodiment, the control signal S1 is a control signal conforming to the inter-integrated circuit (I$^2$C) communication. The I$^2$C communication is for serial communication in which serial data and a serial clock are sent and received.

The control unit 14 acquires, via the input/output device 143, the temperature information from the temperature detector 15 at regular time intervals. In response to a change in the temperature, the control unit 14 outputs, via the input/output device 143, the control signals S1 and S2 that now correspond to the new temperature. The control unit 14 controls the reference voltage that is output by the booster circuit 11 and the level conversion amount of each of the level conversion circuits 13$_1$, . . . , 13$_n$; and the level conversion circuit 13 generates a bias voltage appropriate for each APD by using each temperature, and it then provides the bias voltage to each APD.

(Operation of Processor)

Next, the operation of the processor 142 will be described.

Figure 3:
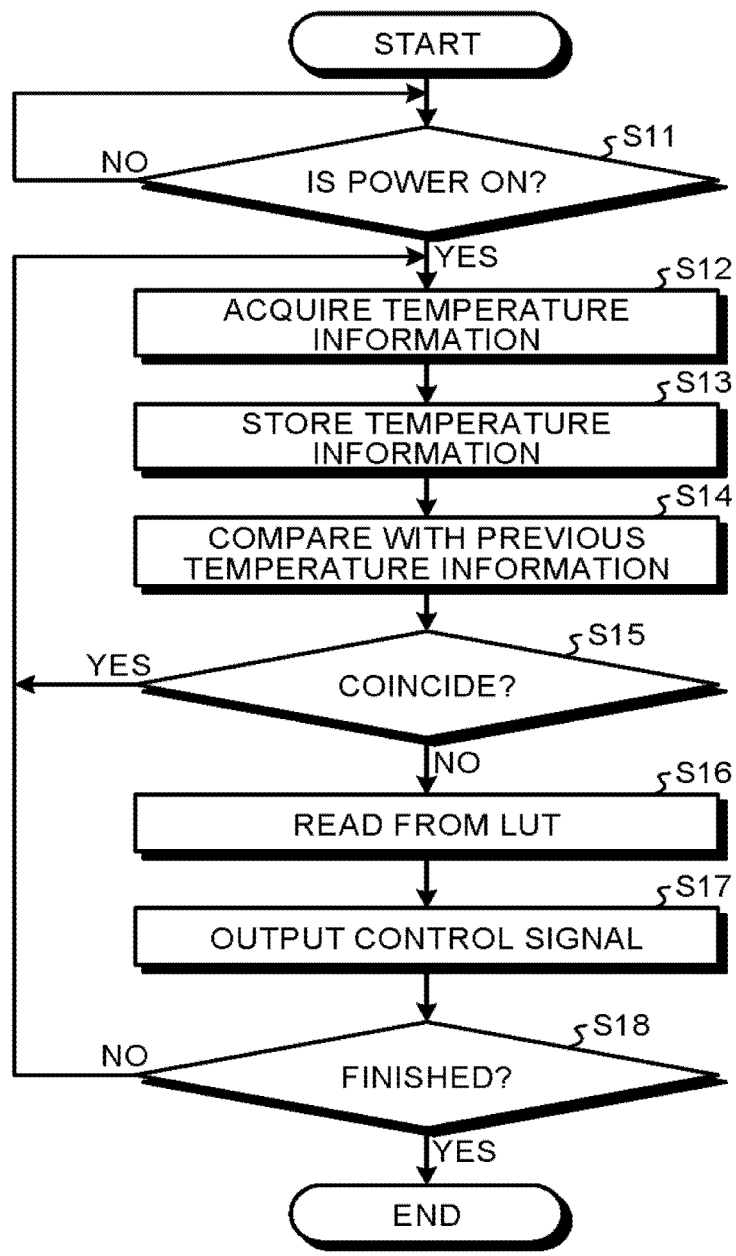
FIG. 3 is a flowchart illustrating an exemplary process of a processor of the light receiving device according to the first embodiment of the present invention.

FIG. 3 is a flowchart illustrating an exemplary process of the processor 142 provided in the control unit 14 of the light receiving device according to the first embodiment of the present invention. At step S11, the processor 142 determines whether the power of the device is on. When the processor 142 determines that the power is on (Yes at step S11), the processor 142 acquires at step S12 the temperature information indicating the temperature of the device from the temperature detector 15 via the input/output device 143 and the bus 144.

At step S13, the processor 142 stores the temperature information in the memory 141 via the bus 144. At step S14, the processor 142 reads the temperature information stored in the memory 141 via the bus 144, and it compares the newly acquired temperature information with the previously acquired temperature information. At step S15, the processor 142 determines from the result of the comparison at step S14 whether the two items of temperature information coincide. When the two items of temperature information do not coincide (No at step S15), the digital values of the control signals S1 and S2 that are respectively output to each of the level conversion circuits and the booster circuit 11 are read from the look-up table 145 via the bus 144 at step S16. The digital values of the control signals S1 and S2 read from the look-up table 145 are values corresponding to the newly acquired temperature information. At step S17, the processor 142 outputs the control signals S1 and S2 having the read digital values, respectively, to each of the level conversion circuits 13$_1$, . . . , 13$_n$ and the booster circuit 11 via the bus 144 and the input/output device 143.

At step S18, it is determined whether to finish the process of the processor 142. When it is determined that the process of the processor 142 is to be finished (Yes at step S18), the process is duly finished. For example, it is determined to finish the process of the processor 142 when the power of the device is turned off.

At step S18, when it is determined the process of the processor 142 is not finished (No at step S18), the processor 142 returns to step S12 and continues the process of steps S12 to S18. At step S15, when the two items of temperature information coincide (Yes at step S15), then, because the temperature has not changed, the processor 142 returns to step S12 without reading the digital values of the control signals S1 and S2 and continues the process from steps S12 to S18.

At step S11, when the processor 142 determines that the power of the device is not activated, the processor 142 returns to step S11 (No at step S11) and continues the process.

(Exemplary Configuration of Level Conversion Circuit)

Figure 4:
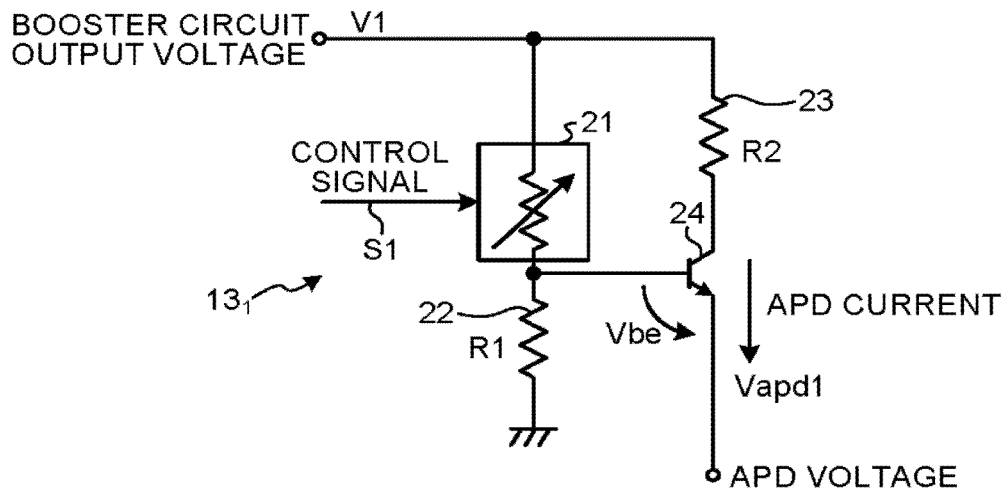
FIG. 4 is a diagram illustrating an example of a configuration of a level conversion circuit of the light receiving device according to the first embodiment of the present invention.

FIG. 4 is a diagram illustrating an example of the configuration of the level conversion circuit 13$_1$ of the light receiving device according to the first embodiment of the present invention. As illustrated in FIG. 4, the level conversion circuit 13$_1$ has a variable resistance unit 21, a fixed resistor 22, a fixed resistor 23, and a transistor 24. The reference voltage V1 is applied to one end of the variable resistance unit 21. One end of the fixed resistor 22 is connected to the other end of the variable resistance unit 21, and the other end of the fixed resistor 22 is connected to the ground. The fixed resistor 23 functions as a collector resistor. The transistor 24 is a semiconductor device constituting an emitter follower circuit. In the first embodiment, the transistor 24 is an npn transistor.

In the variable resistance unit 21, a resistance value is set in accordance with the first control signal S1 output from the control unit 14. In the first embodiment, a digital potentiometer is used as the variable resistance unit 21. However, any type of variable resistance unit 21 can be used.

In the level conversion circuit 13$_1$, the variable resistance unit 21 and the fixed resistor 22 serve as a divided resistance circuit, and the voltage level of the reference voltage V1 is converted by the divided resistance circuit. In other words, in the first embodiment, the divided resistance circuit includes the variable resistance unit 21 having the resistance value that varies in accordance with the control signal S1, and the fixed resistor 22 connected to the variable resistance unit 21. The level conversion circuit 13$_1$ converts, by using the variable resistance unit 21, the level of a voltage divided by the divided resistance circuit, the level of which is a voltage level at a connection point between the variable resistance unit 21 and the fixed resistor 22, and provides the converted voltage to the corresponding APD 16$_1$ as the bias voltage Vapd1.

The voltage at the connection point between the variable resistance unit 21 and the fixed resistor 22 is provided to a base of the npn transistor 24 after being subjected to a voltage-level conversion. Therefore, the voltage drops from a base voltage of the transistor 24 by the value of a base-emitter voltage Vbe of the transistor 24; and the dropped voltage is output from the level conversion circuit 13$_1$. For example, the base-emitter voltage Vbe of the transistor 24 is about 0.8 V. The emitter of the transistor 24 is connected to the corresponding APD $16_1$, and thus the emitter follower circuit is formed.

The level conversion circuit $13_1$ provides the bias voltage Vapd1 to the corresponding APD $16_1$ as an APD voltage. A photocurrent that flows when the APD $16_1$ receives a light signal, that is an APD current, flows from the booster circuit 11 through a collector and the emitter of the transistor 24.

The level conversion circuit $13_1$ can vary the resistance value of the variable resistance unit 21 to adjust the bias voltage Vapd1 that is provided to the APD $16_1$. The level conversion circuit $13_1$ can adjust the bias voltage Vapd1 in the range between the reference voltage V1 [V] and the voltage Vbe [V].

A pnp transistor or a field-effect transistor can be used in place of the npn transistor 24.

(Variable Resistance Unit)

Figure 5:
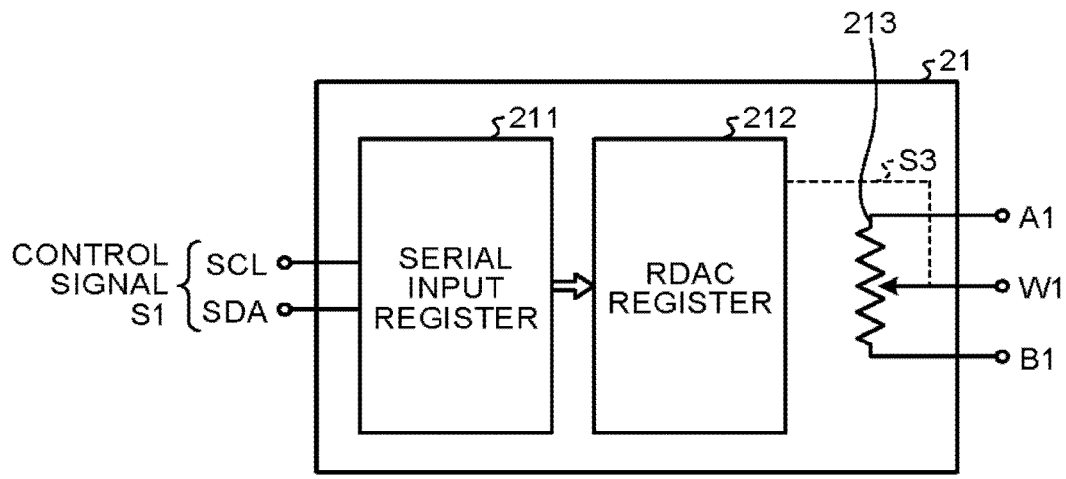
FIG. 5 is a diagram illustrating an exemplary configuration of a variable resistance unit of the light receiving device according to the first embodiment of the present invention.

FIG. 5 is a diagram illustrating an exemplary configuration of the variable resistance unit 21 in the first embodiment. As illustrated in FIG. 5, the variable resistance unit 21 has a serial input register 211, a resistor digital-to-analog converter (RDAC) register 212, and a variable resistor 213. The serial input register 211 converts the first control signal S1 output from the control unit 14 into a parallel signal. The RDAC register 212 generates a control signal S3 for the resistance value in accordance with the parallel signal. In the variable resistor 213, the resistance value is set in accordance with the control signal S3.

As mentioned above, in the first embodiment, the first control signal S1 output from the control unit 14 is the control signal conforming to the I²C communication. The first control signal S1 conforming to the I²C communication includes serial data SDA and a serial clock SCL in the first embodiment. The serial input register 211 converts the serial data SDA into a parallel signal that is in synchronization with the serial clock SCL.

The RDAC register 212 converts the parallel signal into an analog signal, and then it outputs the analog signal as the control signal S3 for the resistance value.

The variable resistor 213 has terminals A1, B1, and W1. The maximum resistance value to which the variable resistor 213 can be set is obtained between the terminal A1 and the terminal B1. The terminal W1 is a wiper terminal connected to a wiper contact for selecting the resistance value of the variable resistor 213.

In the variable resistance unit 21, the reference voltage V1 is provided to the terminal A1, and the fixed resistor 22 is connected to the terminal W1. The resistance value between the terminal A1 and the terminal W1 is set in accordance with the control signal S1 output from the control unit 14; and the voltage, determined by the divided resistance circuit by using the resistance value between the terminal A1 and the terminal W1 and a resistance value of the fixed resistor 22, is provided to the base of the transistor 24.

All the other level conversion circuits $13_2, \ldots, 13_n$ in FIG. 1 as well as the level conversion circuit $13_1$ are configured as mentioned above and operate in a similar manner.

(Method of Generating Look-Up Table)

Next, a method of generating the look-up table for the bias voltage for the APD will be described. The method is performed by the control unit 14. As mentioned above, the look-up table 145 is the table that correlates the temperature information with the digital value of the first control signal S1 for each of the level conversion circuits $13_1, \ldots, 13_n$ and with the digital value of the second control signal S2 for the booster circuit 11. In the first embodiment, a table that correlates the temperature information with the digital value of the second control signal S2 for the booster circuit 11 and a table that correlates the temperature information with the digital value of the first control signal S1 for each of the level conversion circuits $13_1, \ldots, 13_n$ are generated, and the two tables are then combined, whereby the look-up table 145 is generated.

Figure 6:
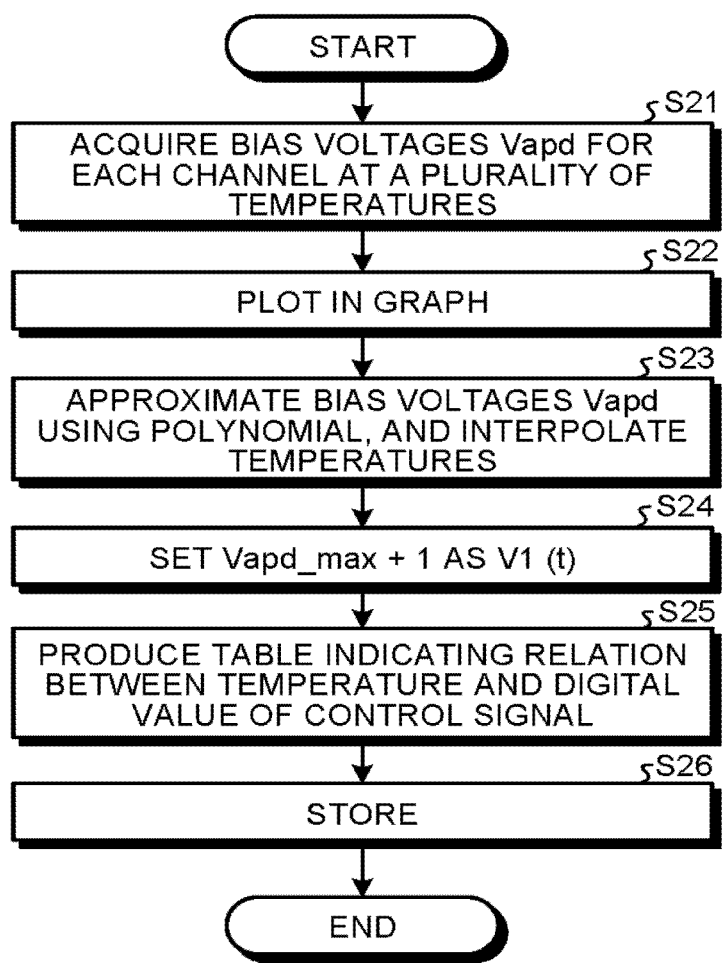
FIG. 6 is a flowchart illustrating a procedure for generating a table that correlates temperature information with a control signal for a booster circuit in the light receiving device according to the first embodiment of the present invention.
Figure 7:
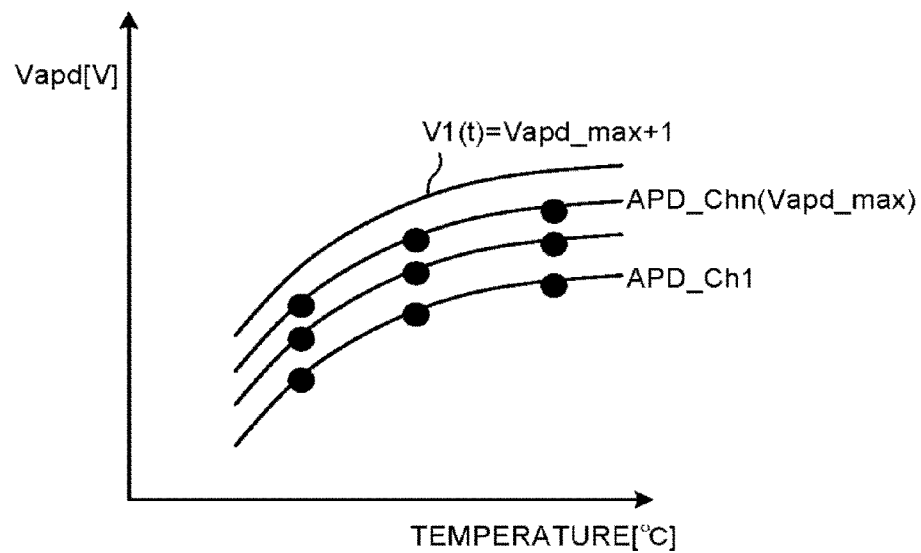
FIG. 7 is a diagram illustrating temperature dependence of a bias voltage in the light receiving device according to the first embodiment of the present invention.

FIG. 6 is a flowchart illustrating a procedure for generating the table that correlates the temperature information with the digital value of the control signal S2 for the booster circuit 11 in the light receiving device according to the first embodiment of the present invention. FIG. 7 is a diagram illustrating temperature dependence of the bias voltage in the light receiving device according to the first embodiment of the present invention.

First, a method of generating the digital value of the control signal S2 for the booster circuit 11 that generates the reference voltage V1 will be described. As illustrated in FIG. 6, at step S21, optimal bias voltages Vapd for the APD connected to each channel are acquired at a plurality of points, i.e., at a plurality of types of temperature. At step S22, the bias voltages Vapd measured at the types of temperatures are plotted on a graph. At step S23, the bias voltages Vapd at the temperatures are approximated by using a polynomial; and bias voltages at unmeasured temperatures are calculated by means of interpolation.

Degrees of temperature dependence of the bias voltages for the respective channels $Ch_1$ to $Ch_n$ are obtained, and the graph illustrated in FIG. 7 is produced. In the graph illustrated in FIG. 7, the measured temperatures are indicated by black circles. Curve portions without the black circles are interpolated portions. A channel that requires the largest bias voltage at each temperature is found with reference to the graph illustrated in FIG. 7. The largest bias voltage is referred to as a maximum bias voltage Vapd_max.

At step S24, a voltage higher than the maximum bias voltage Vapd_max by one volt, that is, maximum bias voltage Vapd_max+1 [V] is set as the reference voltage V1 (t). Note that (t) indicates that the value is dependent on the temperature t. The same applies to the following description. The reason for 1 [V] is that the base-emitter voltage Vbe of the NPN transistor 24 is about 0.8 [V] and it is taken into consideration of variations in the base-emitter voltage Vbe that depends on the temperature and the semiconductor device. In other words, the voltage value, which is determined on the basis of the voltage between the base terminal that is the control terminal and the emitter terminal that is the output terminal of the transistor used in the level conversion circuit, is added to the maximum bias voltage Vapd_max, whereby the reference voltage V1 is generated.

Based on the maximum bias voltage Vapd_max+1, the table indicating the relation between the temperature t and the digital value of the second control signal S2 for causing the booster circuit 11 to output the reference voltage V1 (t) is generated at step S25. When the temperature t is given, the control unit 14 refers to the generated table to output the second control signal S2 that corresponds to the temperature t. The second control signal S2 is a signal for causing the booster circuit 11 to output, as the reference voltage V1, a voltage that corresponds to the temperature t on the maximum bias voltage Vapd_max+1 indicated by a solid line in FIG. 7. At step S26, the generated table is stored in the memory 141 or a register in the processor 142.

Figure 8:
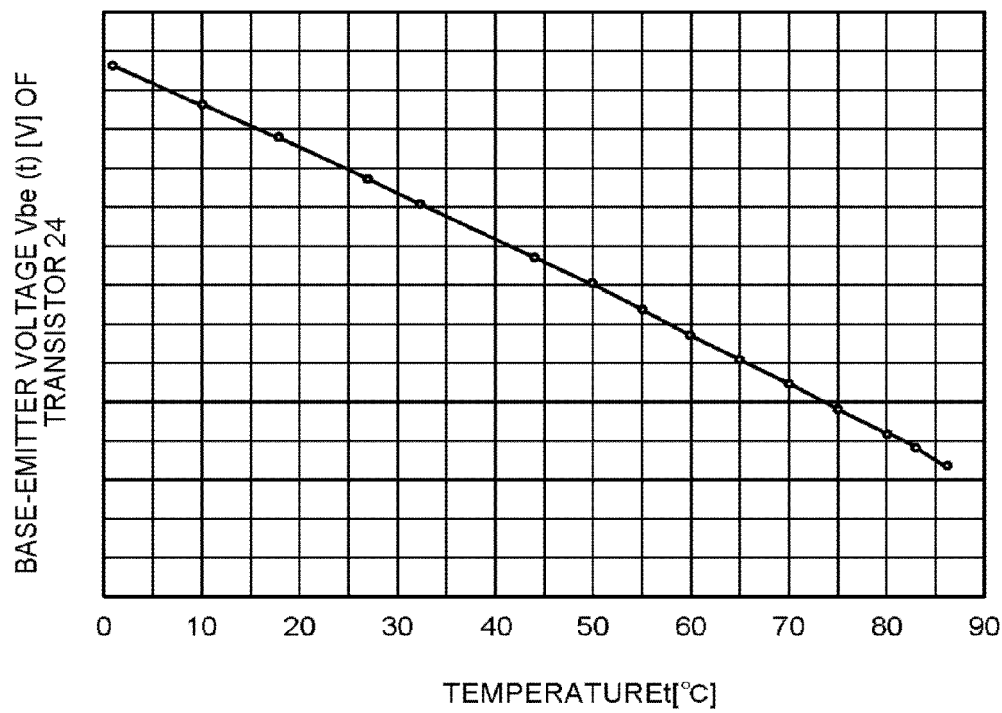
FIG. 8 is a diagram illustrating an example of the temperature characteristics of the base-emitter voltage of a transistor for use in the light receiving device according to the first embodiment of the present invention.

Next, a method of generating the digital value of the control signal S1 for the level conversion circuit for generating the bias voltage Vapd for each channel will be described. First, a temperature dependence table for the base-emitter voltage Vbe (t) of the transistor 24 for use is prepared. FIG. 8 is a diagram illustrating an example of temperature characteristics of the base-emitter voltage Vbe (t) of the transistor 24 for use in the light receiving device according to the first embodiment of the present invention. As illustrated in FIG. 8, the base-emitter voltage Vbe (t) of the transistor 24 decreases as the temperature t [° C.] rises. The base-emitter voltage Vbe (t) of the transistor 24 rises as the temperature t [° C.] decreases. FIG. 9 is a diagram illustrating an example of the temperature dependence table for the base-emitter voltage Vbe (t) of the transistor 24 for use in the light receiving device according to the first embodiment of the present invention. As illustrated in FIG. 9, in the temperature dependence table, the base-emitter voltage Vbe (t) of the transistor 24 has a high voltage value when the temperature t [° C.] of the device is low, and the base-emitter voltage Vbe (t) of the transistor 24 has a low voltage value when the temperature t [° C.] of the device is high. In other words, the temperature dependence table illustrated in FIG. 9 indicates that the base-emitter voltage Vbe (t) decreases in response to a rise in the temperature, and the base-emitter voltage Vbe (t) rises in response to a decrease in the temperature.

Figure 10:
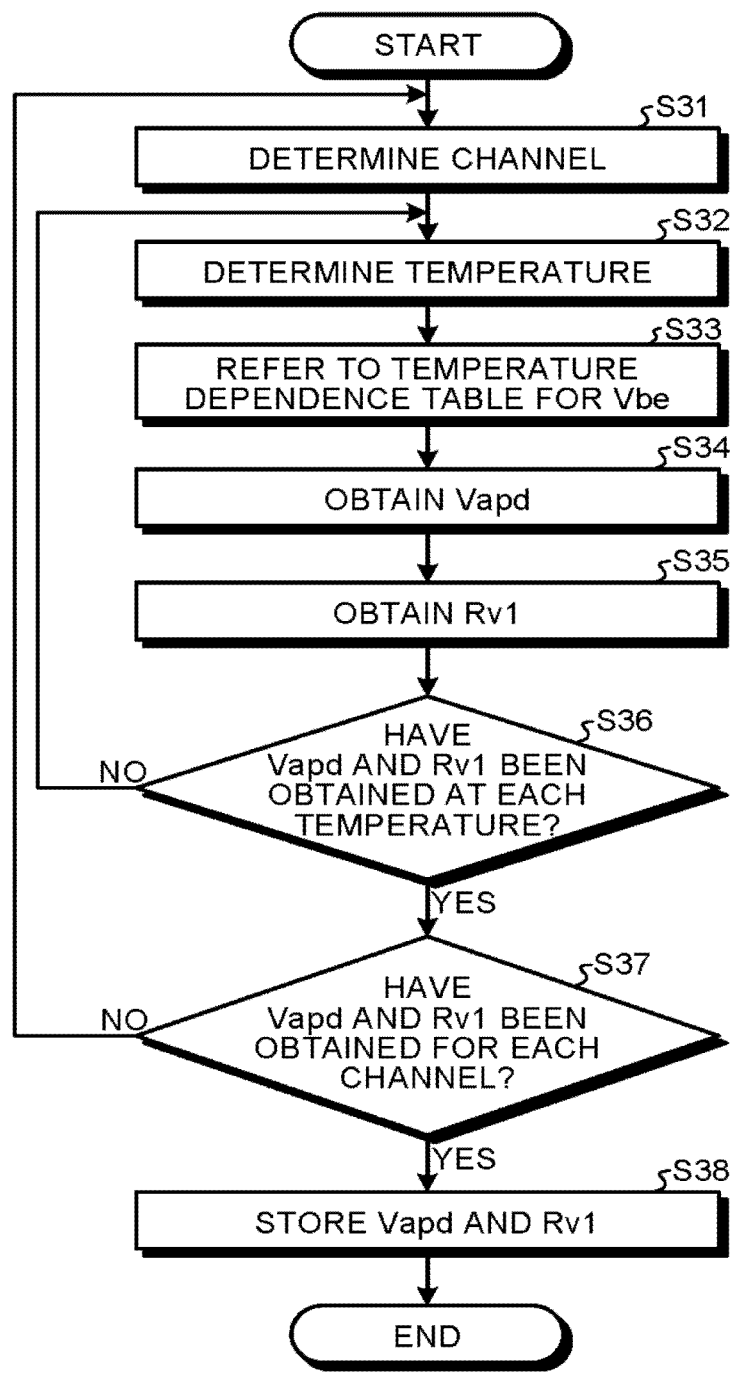
FIG. 10 is a flowchart illustrating a procedure for generating a table that correlates the temperature information with a control signal for the level conversion circuit in the light receiving device according to the first embodiment of the present invention.

FIG. 10 is a flowchart illustrating a procedure for generating the table that correlates the temperature information with the digital value of the control signal S1 for each of the level conversion circuits $13_1, \ldots, 13_n$ in the light receiving device according to the first embodiment of the present invention. As illustrated in FIG. 10, a channel to be processed is determined at step S31. At step S32, the temperature t is determined. At step S33, the temperature dependence table for Vbe (t) of the transistor 24 is referred to. At step S34, the bias voltage Vapd (t) is obtained. The bias voltage Vapd (t) is obtained as described in Expression (1) by using the resistance value R1 of the fixed resistor 22, the reference voltage V1 (t), the base-emitter voltage Vbe (t), and the resistance value Rv1 (t) of the variable resistance unit 21.

[Expression 1]

$$Vapd(t) = \frac{R1}{R1 + Rv1(t)} V1(t) - Vbe(t)[V] \quad (1)$$

At step S35, the resistance value Rv1 (t) of the variable resistance unit 21 required for generating the bias voltage Vapd (t) for the APD $16_1$ is obtained. The resistance value Rv1 (t) can be obtained as described in Expression (2). Since the reference voltage V1 (t), the bias voltage Vapd (t), and the base-emitter voltage Vbe (t) have already been known; the variable resistance value Rv1 (t) at each temperature can be obtained by using these values.

[Expression 2]

$$Rv1(t) = \frac{V1(t)R1}{Vapd(t) + Vbe(t)} - R1[\Omega] \quad (2)$$

At step S36, it is determined whether the bias voltage Vapd (t) and the resistance value Rv1 (t) have been obtained at each temperature. In a case where the bias voltage Vapd (t) and the resistance value Rv1 (t) have been obtained at each temperature (Yes at step S36), it is determined at step S37 whether the bias voltage Vapd (t) and the resistance value Rv1 (t) have been obtained for each channel.

In a case where the bias voltage Vapd (t) and the resistance value Rv1 (t) have been obtained for each channel (Yes at step S37), the bias voltage Vapd (t) and the resistance value Rv1 (t) are stored in the memory 141 or the resister in the processor 142 at step S38.

At step S36, in a case where the bias voltage Vapd (t) and the resistance value Rv1 (t) have not been obtained at each temperature (No at step S36), the control unit 14 returns to step S32 and continues the process of obtaining the bias voltage Vapd (t) and the resistance value Rv1 (t) at another temperature.

At step S37, in a case where the bias voltage Vapd (t) and the resistance value Rv1 (t) have not been obtained for each channel (No at step S37), the control unit 14 returns to step S31 and continues the process of obtaining the bias voltage Vapd (t) and the resistance value Rv1 (t) for another channel.

In the above-mentioned manner, the control unit 14 can generate a table in which the digital value of the control signal S1 for the resistance value Rv1 (t) is stored in association with each temperature. The control unit 14 generates such a table for each of the n channels, and stores, as the look-up table 145 in the memory 141, the digital value of the second control signal S2 for the reference voltage V1 (t) and the digital value of the first control signal S1 for the resistance value Rv1 (t) in the level conversion circuit for each channel in association with each temperature.

The process in FIG. 6 and the process in FIG. 10 mentioned above can be performed by the control unit 14. Alternatively, a device different from the control unit 14 can perform the processes and store the look-up table 145 in the memory 141. In the first embodiment, the control unit 14 performs the process in FIG. 6 and the process in FIG. 10 and stores the look-up table 145 in the memory 141.

(Example of Table)

Figure 11:
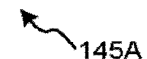
FIG. 11 is a diagram illustrating an example of the table indicating the correlation between the temperature and the control signal for the level conversion circuit in the light receiving device according to the first embodiment of the present invention.

FIG. 11 is a diagram illustrating an example of the table indicating the correlation between the temperature t [° C.] and the digital value of the first control signal S1 for each of the level conversion circuits $13_1, \ldots, 13_n$ in the light receiving device according to the first embodiment of the present invention. The control unit 14 can generate the table 145A illustrated in FIG. 11 as the result of the process illustrated in FIG. 10.

Figure 12:
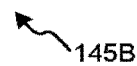
FIG. 12 is a diagram illustrating an example of the table indicating the correlation between the temperature and the control signal for the booster circuit in the light receiving device according to the first embodiment of the present invention.

FIG. 12 is a diagram illustrating an example of the table indicating the correlation between the temperature t [° C.] and the digital value of the second control signal S2 for the booster circuit 11 in the light receiving device according to the first embodiment of the present invention. The control unit 14 can generate the table 1453 illustrated in FIG. 12 as the result of the process in FIG. 6.

Figure 13:
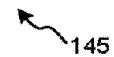
FIG. 13 is a diagram illustrating an example of a look-up table in the light receiving device according to the first embodiment of the present invention.

FIG. 13 is a diagram illustrating an example of the look-up table in the light receiving device according to the first embodiment of the present invention. The control unit 14 can combine the table 145A illustrated in FIG. 11 with the table 145B illustrated in FIG. 12 so as to generate the look-up table 145 illustrated in FIG. 13.

As described above, the look-up table 145 is generated and stored in the memory 141 of the control unit 14, and the first control signal S1 and the second control signal S2 that correspond to the detected temperature are read from the memory 141 and output from the control unit 14 by the input/output device 143, whereby the light receiving device 10 can provide the optimal bias voltages to the APDs $16_1, \ldots, 16_n$ for the respective channels. The light receiving device 10 can generate the bias voltages for the APDs $16_1, \ldots, 16_n$ for the multiple channels by using the single booster circuit 11 and the level conversion circuits 13$_1$, ..., 13$_n$ configured by using simple circuits. Therefore, an increase in the size of the light receiving device 10 can be suppressed. The original reference voltage V1 is controlled in accordance with each temperature, whereby the voltage that is higher than necessary is not generated. Therefore, an increase in the power consumption of the light receiving device 10 can also be suppressed. Furthermore, the light receiving device 10 can drive the APDs 16$_1$, ..., 16$_n$ for the respective channels at the optimal bias voltages at any time.

The best receiving sensitivity of the APD depends on its multiplication factor. Therefore, the bias voltage for each of the APDs 16$_1$, ..., 16$_n$ is generally set so that the best receiving sensitivity is obtained. However, because the multiplication factor of the APD has temperature characteristics, the multiplication factor varies in accordance with the temperature in a case where the reference voltage output from the booster circuit 11 has a fixed value. In this regard, in the first embodiment, the light receiving device 10 includes the control unit 14 shared by the APDs. Therefore, an increase in the size of the device can be suppressed in the light receiving device 10, as compared with a light receiving device including separate control units for respective APDs. In addition, an increase in the number of components can be reduces in the light receiving device 10, as compared with a light receiving device including separate control units for respective APDs. Consequently, the power consumption of the light receiving device 10 can be reduced, and an increase in the cost for the device can be reduced.

Second Embodiment

Figure 14:
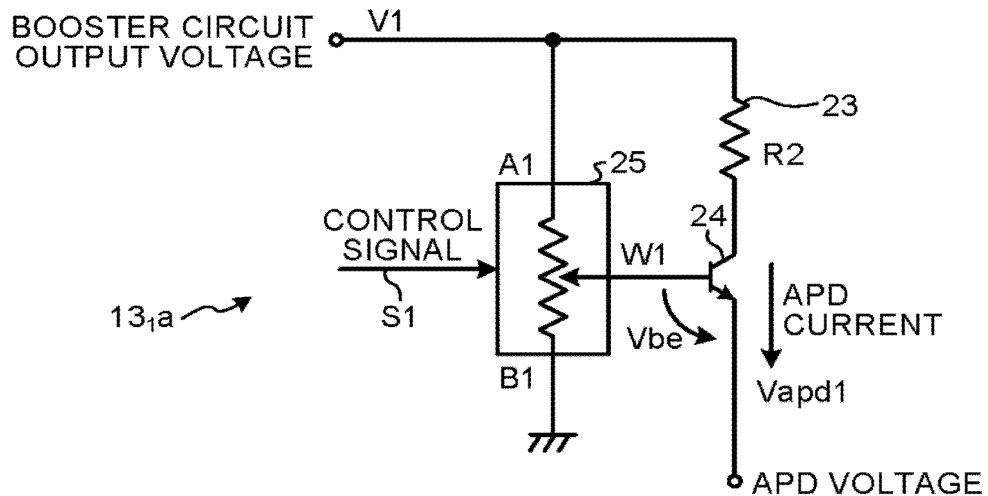
FIG. 14 is a diagram illustrating an example of a level conversion circuit of a light receiving device according to a second embodiment of the present invention.

The level conversion circuit 13$_1$ used in the above-mentioned first embodiment can be differently configured. FIG. 14 is a diagram illustrating an exemplary configuration of a level conversion circuit 13$_1$a in a second embodiment. As illustrated in FIG. 14, the level conversion circuit 13$_1$a has a variable resistance unit 25, the fixed resistor 23 that functions as the collector resistor, and the NPN transistor 24 constituting the emitter follower circuit. The reference voltage V1 is applied to the variable resistance unit 25, and a resistance value of the variable resistance unit 25 varies in accordance with the first control signal S1.

In the second embodiment, a divided resistance circuit includes the variable resistance unit 25 having the resistance value that varies in accordance with the first control signal S1. The level conversion circuit 13$_1$a converts a level of a voltage of a wiper terminal of the variable resistance unit 25 in order to generate the bias voltage Vapd1 that is the bias signal, and provides the bias voltage Vapd1 to the corresponding APD 16$_1$ as the APD voltage.

The variable resistance unit 25 has a configuration similar to that of the variable resistance unit 21 described with reference to FIG. 5. However, the reference voltage V1 is provided to the terminal A1 illustrated in FIG. 5, the base of the transistor 24 is connected to the terminal W1, and the ground is connected to the terminal B1. Consequently, the variable resistance unit 25 functions as a three-terminal variable resistor, and the fixed resistor 22 in FIG. 4 does not need to be provided in the light receiving device 10.

In the variable resistance unit 25, a resistance value R1 between the terminal A1 and the terminal B1, a resistance value Rhigh between the terminal A1 and the terminal W1, and a resistance value Rv1 between the terminal W1 and the terminal B1 are set in accordance with the first control signal S1 output from the control unit 14. The voltage determined by the divided resistance circuit using the resistance values set in the variable resistance unit 25 in accordance with the first control signal S1 is provided to the base of the transistor 24.

In the second embodiment, a control method and a procedure for generating the look-up table are the same as those of the first embodiment. However, a relational expression of the bias voltage Vapd (t) for the APD and the reference voltage V1 (t) are different. The relational expression is represented by Expression (3). Therefore, the resistance value Rv1 (t) can be obtained by using Expression (4).

[Expression 3]
$$Vapd(t) = \frac{Rv1(t)}{R1}V1(t) - Vbe(t)[V] \qquad (3)$$

[Expression 4]
$$Rv1(t) = \frac{(Vapd(t) + Vbe(t))}{V1(t)}R1[\Omega] \qquad (4)$$

All the other level conversion circuits as well as the level conversion circuit 13$_1$a are configured as mentioned above and function similarly in the above-mentioned manner.

In the second embodiment, h voltage can be variable in the range of 0 [V] to (V1−Vbe) [V]. In the second embodiment, therefore, the bias voltage that is the bias signal can be variable in a broader range than the bias voltage in the first embodiment. Consequently, the bias voltage that is more appropriate than that of the first embodiment can be provided to each APD. In the second embodiment, the divided resistance circuit can be realized by the variable resistance unit 25 alone. In the second embodiment, therefore, the number of components can be reduced, and an increase in the cost of the device can be suppressed as compared with the first embodiment.

Third Embodiment

Figure 15:
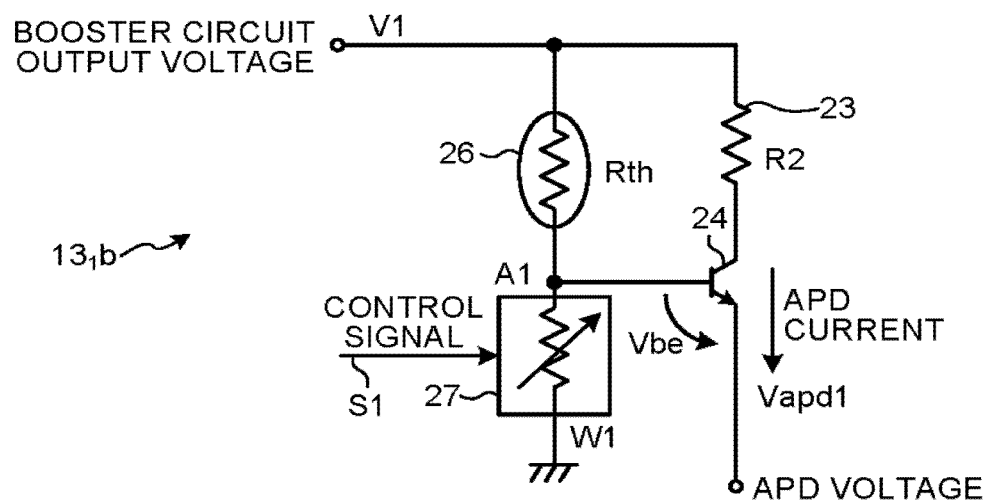
FIG. 15 is a diagram illustrating an example of a level conversion circuit of a light receiving device according to a third embodiment of the present invention.

The level conversion circuit 13$_1$ used in the above-mentioned first embodiment can be configured differently. FIG. 15 is a diagram illustrating an exemplary configuration of a level conversion circuit 13$_1$b in a third embodiment. As illustrated in FIG. 15, the level conversion circuit 13$_1$b has a thermistor 26, a variable resistance unit 27, the fixed resistor 23 that functions as the collector resistor, and the NPN transistor 24 constituting the emitter follower circuit. The reference voltage V1 is applied to the thermistor 26. A resistance value of the variable resistance unit 27 varies in accordance with the control signal S1.

In the third embodiment, a divided resistance circuit includes the variable resistance unit 27 that has the resistance value that varies in accordance with the first control signal S1, and the thermistor 26 connected to the variable resistance unit 27 and having a resistance value that varies in accordance with the temperature. The level conversion circuit 13$_1$b converts a voltage at a connection point between the variable resistance unit 27 and the thermistor 26 in order to generate the bias voltage Vapd1 that is the bias signal, and provides the bias voltage Vapd1 to the corresponding APD 16$_1$ as the APD voltage.

The variable resistance unit 27 has a configuration similar to that of the variable resistance unit 21 described with reference to FIG. 5. However, the thermistor 26 is connected to the terminal A1, and the ground is connected to the terminal W1.

The thermistor 26 has a negative temperature coefficient (NTC) property, in which the resistance value Rth decreases as the temperature rises. In the third embodiment, therefore, if temperature characteristics of the resistance value Rth of the thermistor 26 have linearity, temperature compensation for the bias voltage Vapd can be performed without the need for varying the control signal S1 that is output from the control unit 14 in accordance with a change in the temperature. Specifically, the bias voltage Vapd1 is increased due to a change in the resistance value Rth of the thermistor 26 as the temperature of the device rises, and the bias voltage Vapd1 is reduced as the temperature of the device falls.

In the third embodiment, therefore, the look-up table 145 stores the temperature and the digital value of the second control signal S2 for the booster circuit 11, and it does not store the digital value of the first control signal S1 for each level conversion circuit. In this case, the variable resistance unit 27 can be replaced by a fixed resistor. According to the third embodiment, the temperature compensation for the bias voltage Vapd1 can be performed by using a simple configuration and simple control as compared with the first embodiment and the second embodiment. The memory 141 only requires a small storage capacity, which is another advantage of the third embodiment.

Alternatively, in the third embodiment, the look-up table 145 can store the digital value of the first control signal S1 for setting the resistance value of the variable resistance unit 27 to a fixed value, not to a value that depends on the temperature.

Meanwhile, in a case where the temperature characteristics of the resistance value Rth of the thermistor 26 do not have the linearity, the optimal bias voltage for each APD can be provided at each temperature in such a manner that the look-up table 145 is generated in consideration of the temperature characteristics of the resistance value Rth of the thermistor 26, and the resistance value of the variable resistance unit 27 is set in accordance with a change in the temperature of the device. In this case, a control method and a procedure for generating the look-up table are the same as those of the first embodiment.

All the other level conversion circuits other than the level conversion circuit 13₁b are configured as mentioned above and similarly function in the above-mentioned manner.

Note that the configuration described in the above-mentioned embodiments indicates an example of the contents of the present invention. The configuration can be combined with another well-known technique, and a part of the configuration can be omitted or changed in a range not departing from the gist of the present invention.

REFERENCE SIGNS LIST

10 light receiving device, 11 booster circuit, 12 filter, 14 control unit, 15 temperature detector, 21, 25, 27 variable resistance unit, 22, 23 fixed resistor, transistor, 26 thermistor, 13₁, 13₂, 13ₙ, 13₁a, 13₁b level conversion circuit, 141 memory, 142 processor, 143 input/output device, 144 bus, 145 look-up table, 16₁, 16ₙ APD 17₁, 17ₙ TIA, 18₁, 18ₙ amplifier, 211 serial input register, 212 RDAC register, 213 variable resistor, A1, B1, W1 terminal, S1, S2, S3 control signal, V1 reference voltage, Vapd bias voltage.

The invention claimed is:

1. A light receiving device that receives a light signal, the light receiving device comprising:
   a plurality of avalanche photodiodes, in each of which receiving sensitivity is set in accordance with a bias signal provided;
   a plurality of level conversion units provided in association with the avalanche photodiodes, each of the level conversion units
      being configured to convert a level of a reference voltage for obtaining the bias signal so as to generate the bias signal and
      being configured to provide the bias signal to a corresponding one of the avalanche photodiodes; and
   a control unit
      to generate a first control signal corresponding to a temperature of the light receiving device, and
      to control a level conversion amount of each of the level conversion units by using the first control signal; and
   a booster unit
      to boost a power supply voltage so as to generate the reference voltage, and
      to provide the reference voltage to the level conversion units, wherein
   each of the level conversion units converts the level of the reference voltage on the basis of the first control signal so as to generate the bias signal,
   the booster unit generates the reference voltage by adding a voltage value determined on the basis of a voltage between an output terminal and a control terminal of a transistor used in the level conversion unit to a voltage that is the largest of the bias signals for the avalanche photodiodes, and
   the control unit generates a second control signal corresponding to the temperature of the light receiving device and controls the reference voltage generated by the booster unit by using the second control signal.

2. The light receiving device according to claim 1, wherein
   the control unit
      includes a table that correlates the temperature of the light receiving device with the first control signal and with the second control signal,
      reads the first control signal corresponding to the temperature of the light receiving device from the table,
      outputs the first control signal that is read to each of the level conversion units, and
      outputs, to the booster unit, the second control signal read from the table in accordance with the temperature of the light receiving device.

3. The light receiving device according to claim 1, wherein
   each of the level conversion units
      has a divided resistance circuit to divide a voltage between the reference voltage and ground by using the first control signal, and
   each of the level conversion units
      generates the bias signal by using the voltage that is divided by the divided resistance circuit, and
      provides the bias signal to the corresponding one of the avalanche photodiodes.

4. The light receiving device according to claim 3, wherein
   the divided resistance circuit includes
      a variable resistance unit having a resistance value that varies in accordance with the first control signal, and
      a resistor connected to the variable resistance unit, and
   each of the level conversion units
      converts a level of a voltage at a connection point between the variable resistance unit and the resistor so as to generate the bias signal, and provides the bias signal to the corresponding one of the avalanche photodiodes.

5. The light receiving device according to claim 3, wherein the divided resistance circuit includes a variable resistance unit having a resistance value that varies in accordance with the first control signal, and each of the level conversion units converts a level of a voltage of a wiper terminal of the variable resistance unit so as to generate the bias signal, and provides the bias signal to the corresponding one of the avalanche photodiodes.

6. The light receiving device according to claim 3, wherein the divided resistance circuit includes a variable resistance unit having a resistance value that varies in accordance with the first control signal, and a thermistor connected to the variable resistance unit and having a resistance value that varies in accordance with the temperature, and each of the level conversion units converts a level of a voltage at a connection point between the variable resistance unit and the thermistor so as to generate the bias signal, and provides the bias signal to the corresponding one of the avalanche photodiodes.

\* \* \* \* \*